(12) United States Patent
Lung

(10) Patent No.: US 6,579,760 B1
(45) Date of Patent: Jun. 17, 2003

(54) SELF-ALIGNED, PROGRAMMABLE PHASE CHANGE MEMORY

(75) Inventor: Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/108,658

(22) Filed: Mar. 28, 2002

(51) Int. Cl.[7] .............................................. H01L 21/336
(52) U.S. Cl. ...................... 438/257; 438/308; 365/103; 365/63; 365/51
(58) Field of Search .......................... 438/257, 95, 128, 438/237, 238, 466, 597; 365/103–100, 113, 163

(56) References Cited

U.S. PATENT DOCUMENTS

| | | | |
|---|---|---|---|
| 4,719,594 A | 1/1988 | Young et al. ................ | 365/113 |
| 5,177,563 A | 1/1993 | Everett et al. ............... | 356/375 |
| 5,687,112 A | 11/1997 | Ovshinsky ................... | 365/163 |
| 5,789,277 A | 8/1998 | Zahorik et al. ............... | 438/95 |
| 5,789,758 A | 8/1998 | Reinberg ...................... | 257/3 |
| 5,814,527 A | 9/1998 | Wolstenholme et al. ....... | 438/5 |
| 5,837,564 A * | 11/1998 | Sandhu et al. .............. | 438/308 |
| 5,879,955 A | 3/1999 | Gonzalez et al. | |
| 5,920,788 A | 7/1999 | Reinberg ..................... | 438/466 |
| 5,952,671 A | 9/1999 | Reinberg ...................... | 257/3 |
| 5,985,698 A | 11/1999 | Gonzalez et al. ............. | 438/128 |
| 6,025,220 A | 2/2000 | Sandhu ........................ | 438/237 |
| 6,031,287 A | 2/2000 | Harshfield ................... | 257/734 |
| 6,034,882 A | 3/2000 | Johnson et al. ............. | 365/103 |
| 6,077,729 A | 6/2000 | Harshfield ................... | 438/128 |
| 6,104,038 A | 8/2000 | Gonzalez et al. .............. | 257/3 |
| 6,111,264 A | 8/2000 | Wolstenholme et al. ....... | 257/3 |
| 6,114,713 A | 9/2000 | Zahorik ........................ | 257/4 |
| 6,117,720 A | 9/2000 | Harshfield ................... | 438/238 |
| 6,131,287 A | 10/2000 | Prochaska et al. ........... | 30/34.2 |
| 6,147,395 A | 11/2000 | Gilgen ........................ | 257/529 |
| 6,150,253 A | 11/2000 | Doan et al. .................. | 438/597 |
| 6,153,890 A | 11/2000 | Wolstenholme et al. ....... | 257/3 |
| 6,185,122 B1 | 2/2001 | Johnson et al. ............. | 365/103 |
| 6,236,059 B1 | 5/2001 | Wolstenholme et al. ....... | 257/3 |
| RE37,259 E | 7/2001 | Ovshinsky ................... | 365/163 |
| 6,314,014 B1 | 11/2001 | Lowrey et al. ............. | 365/100 |
| 6,351,406 B1 | 2/2002 | Johnson et al. ............. | 365/103 |
| 2001/0055838 A1 * | 12/2001 | Walker et al. .............. | 438/129 |
| 2002/0081833 A1 * | 6/2002 | Li et al. ..................... | 438/622 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Wicker et al., "Nonvolatile, High Density, High Performance Phase Change Memory" Ovonyx, Inc., pp. 1–8.

Ovonyx Non–Confidential paper entitled "Ovonic Unified Memory", 12/99, pp. 1–80.

Axon Technologies Corporation paper: Technology Description, pp. 1–6.

Blake Thesis, "Investigation of $Ge_2Te_2Sb_5$ Chalcogenide Films for Use as an Analog Memory", AFIT/GE/ENG/00M–04,Mar. 2000, 121 pages.

* cited by examiner

*Primary Examiner*—David Nelms
*Assistant Examiner*—D Le
(74) *Attorney, Agent, or Firm*—Mark A. Haynes; Haynes Beffel & Wolfeld LLP

(57) ABSTRACT

A self-aligned, nonvolatile memory structure based upon phase change materials, including chalcogenides, can be made with a very small area on an integrated circuit. The manufacturing process results in self-aligned memory cells requiring only two array-related masks defining the bit lines and word lines. Memory cells are defined at intersections of bit lines and word lines, and have dimensions that are defined by the widths of the bit lines and word lines in a self-aligned process. The memory cells comprise structures including a selection device, a heating/barrier plate layer and a phase change memory element, vertically arranged at the intersections of the bit lines and word lines.

20 Claims, 12 Drawing Sheets

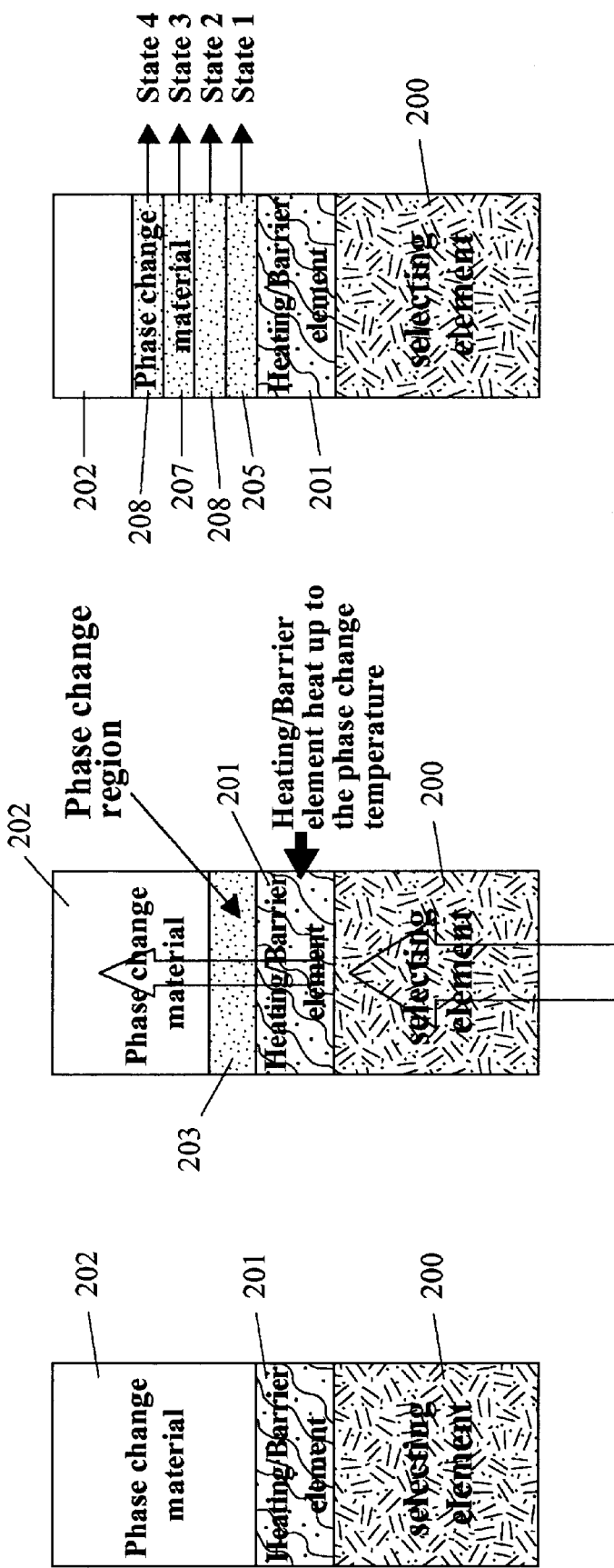

SELF-ALIGNED, PROGRAMMABLE PHASE CHANGE MEMORY

BACKGROUND OF THE INVENTION

1. Field of the Invention

The present invention relates to non-volatile, high density, integrated circuit memory devices, and more particularly to such memory devices based upon phase change material such as chalcogenides.

2. Description of Related Art

Chalcogenides have been utilized in the formation of memory cells for integrated circuit memory devices. Representative prior art patents in this field include Reinberg, U.S. Pat. No. 5,789,758; Harshfield, U.S. Pat. No. 6,077,729; Wolstenholme, et al., U.S. Pat. No. 6,153,890, Ovshinsky, U.S. Reissue Pat. No. RE37,259 (Reissue of U.S. Patent No. 5,687,112), and many others.

Chalcogenides used for integrated circuit memory devices are materials characterized by more than one solid-state phase, and which can be switched between such phases using the application of heat caused for example by electrical current or optical pulses. Memory cells which include a chalcogenide element are arranged in an array which can be addressed using conventional word lines/bit line addressing schemes common in integrated circuit memories. The state of the memory cell is determined by the bulk resistance of the chalcogenide element. Because the different solid-state phases of the chalcogenide have different resistivity, the bulk resistance of the chalcogenide element indicates the amount of the chalcogenide element in a selected phase state.

The problem of applying current at sufficient current densities to cause the phase change in the chalcogenide element is reflected in the design of the memory cells. Typically, relatively complex structures are utilized to form small pores in the current path that is coupled to the chalcogenide element. Current is concentrated through the small pores to induce a locally high current density in the chalcogenide element.

The complex structures utilized to form the pores, and other aspects of chalcogenide based memory cells, have required relatively large cell sizes to implement. Furthermore, complex structures can affect the reliability of the memory devices. Large cell sizes limit the density of the memory device, and increase its cost. Likewise, reliability in manufacturing is critical to successful commercial application of memory devices. High-density, self aligned memory cells have been manufactured for other types of storage technologies, such as the vertically stacked, non-volatile memory described in Johnson et al., U.S. Pat. No. 6,185,122. However, such high-density techniques have not been applied to phase change memory cells.

Accordingly, it is desirable to provide phase change memory cell structures and devices with smaller sizes. Furthermore, it is desirable to provide methods for manufacturing such devices, which are efficient and result in reliable structures.

SUMMARY OF THE INVENTION

The present invention provides a self-aligned, nonvolatile memory structure based upon phase change materials, including chalcogenides, and methods for manufacturing integrated circuit devices using the structure. The memory structure can be made within a very small area on an integrated circuit. For a preferred implementation, the area required for each memory cell in an array is about $4F^2$, where F is equal to the minimum line width for the manufacturing process. Thus, for processes having a minimum line width of 0.1 microns, the memory cell area is about 0.04 microns squared.

Furthermore, the manufacturing process results in self-aligned memory cells requiring only two array-related masks defining the bit lines and word lines. Memory cells are defined at intersections of bit lines and word lines, and have dimensions that are defined by the widths of the bit lines and word lines in a self-aligned process.

The use of phase change materials including chalcogenides, in the structure of the present invention provides for high-density non-volatile and programmable memory devices.

According to one embodiment of the invention, a method for manufacturing a memory device is provided. The method includes forming a multi-layer film on a surface of a substrate, where the multi-layer film includes a first conductive layer, a layer or layers of materials selected for formation of a selection device, and a layer or layers of materials selected for formation of the phase change memory element. The first array-related mask is applied to define a first plurality of lines extending in a first direction. Gaps are etched through the multi-layer film in according to the mask pattern to define the first plurality of lines. An insulating material is used to fill the gaps between the lines in the first plurality of lines.

A second conductive layer is formed over the first plurality of lines and insulating material in the gaps, to form a multi-layer composite. A second array-related mask is applied to define a second plurality of lines extending in a second direction so that the first and second pluralities of lines intersect. Gaps are etched into the multi-layer composite according to the second mask pattern to define the second plurality of lines. The gaps are etched between the second plurality of lines, and extend through the multi-layer composite to the first conductive layer, without removing the first conductor layer.

As a result of the etching steps, self-aligned stacks are formed by remaining portions of said layer or layers of materials selected for formation of a selection device, and said layer or layers of materials selected for formation of a phase change memory element. The selection device and phase change memory element in the self-aligned stacks are in electrical contact with the first plurality of lines in the first conductive layer, and the second plurality of lines remaining from the second conductive layer.

In some embodiments of the invention, the layer or layers of material selected for formation of a selection device comprise a first polysilicon layer with p-type dopant and a second polysilicon layer with n-type dopant adapted for formation of a diode.

Also, in some embodiments of the invention, the layer or layers of material selected for formation of a phase change memory element comprise a layer of chalcogenide. Further, in some embodiments, an intermediate layer is formed between the layer or layers of material selected for formation of a selection device, and the layer of phase change material. In various embodiments, the intermediate layer acts as a barrier to electromigration and diffusion of material between the materials used for the selection device, and the phase change material.

The phase change material has a first phase having a lower resistance, and a second phase having a higher resistance. Also, in various embodiments, the intermediate layer has a resistance that is greater than the higher resistance of the phase change material in the second phase. In this way, the intermediate layer acts as a resistive heating plate to facilitate phase change in the phase change material adjacent the barrier layer.

The present invention also provides a novel memory device. The memory device comprises a substrate. A first plurality of conductive lines on the substrate extend in a first direction. A second plurality of conductive lines above the first plurality of conductive lines, extend in a second direction, and cross over the first plurality of conductive lines at intersections. A plurality of memory cells are interposed at said intersections between, and in electrical contact with, the first and second pluralities of conductive lines. The memory cells comprise self-aligned structures including a selection device and a phase change memory element, vertically arranged at the intersections.

In embodiments of the present invention, the selection device comprises a diode. The phase change memory element comprises a chalcogenide body in various embodiments. In one preferred embodiment, the chalcogenide body comprises a thin film having substantially uniform thickness across the area of the intersection.

In one embodiment, the self-aligned structure comprises a first polysilicon layer and a second polysilicon layer adapted to form the selection device, an intermediate heating/barrier plate layer, and a layer of phase change material. The intermediate layer comprises a barrier to at least one of diffusion and electromigration. In one embodiment, the intermediate layer has a first resistance, and the layer of phase change material has a first state with a first lower resistance, and a second state with a second higher resistance. The first resistance of the intermediate layer is higher than the second higher resistance of the phase change material in the second state, so that the intermediate layer acts as a heating plate facilitating phase change adjacent to barrier layer.

In various embodiments, the phase change memory element is adapted to store more than one bit by assuming more than two bulk resistance states in response to programming current or other programming stimulus.

The memory array of the present invention is formed on a substrate. In some embodiments, the substrate is an integrated circuit device having an insulating layer on the surface. The memory array is manufactured on top of insulating layer, and has contacts to the circuitry integrated into substrate. Preferably, the circuitry integrated into the substrate includes support circuitry for the memory array, including address decoders, sense amplifiers, voltage sources and alike, manufactured for example with conventional CMOS technology. In other embodiments, the circuitry integrated into the substrate may include system-on-a-chip components, including for example, a processor core and other logic.

Accordingly, the present invention provides a unique memory cell that combines polysilicon junctions and chalcogenide memory elements, and a method for manufacturing the memory device comprising the unique cells. The new memory device can be programmed and erased by applying suitable voltage and current to change the resistance of the chalcogenide memory elements. Only two array-related masks are needed to make a memory, and the resulting memory cells are fully self-aligned with the word lines and bit lines of the array. Furthermore, the area within the array for each of the resulting memory cells is only $4F^2$, where F is the minimum line width for the manufacturing process.

Other aspects and advantages of the present invention can be seen on review of the drawings, the detailed description and the claims, which follow.

BRIEF DESCRIPTION OF THE DRAWINGS

FIGS. 12A–12C schematically illustrate operation of the self-aligned memory cells in single bit and multibit applications.

DETAILED DESCRIPTION

Figure 1:
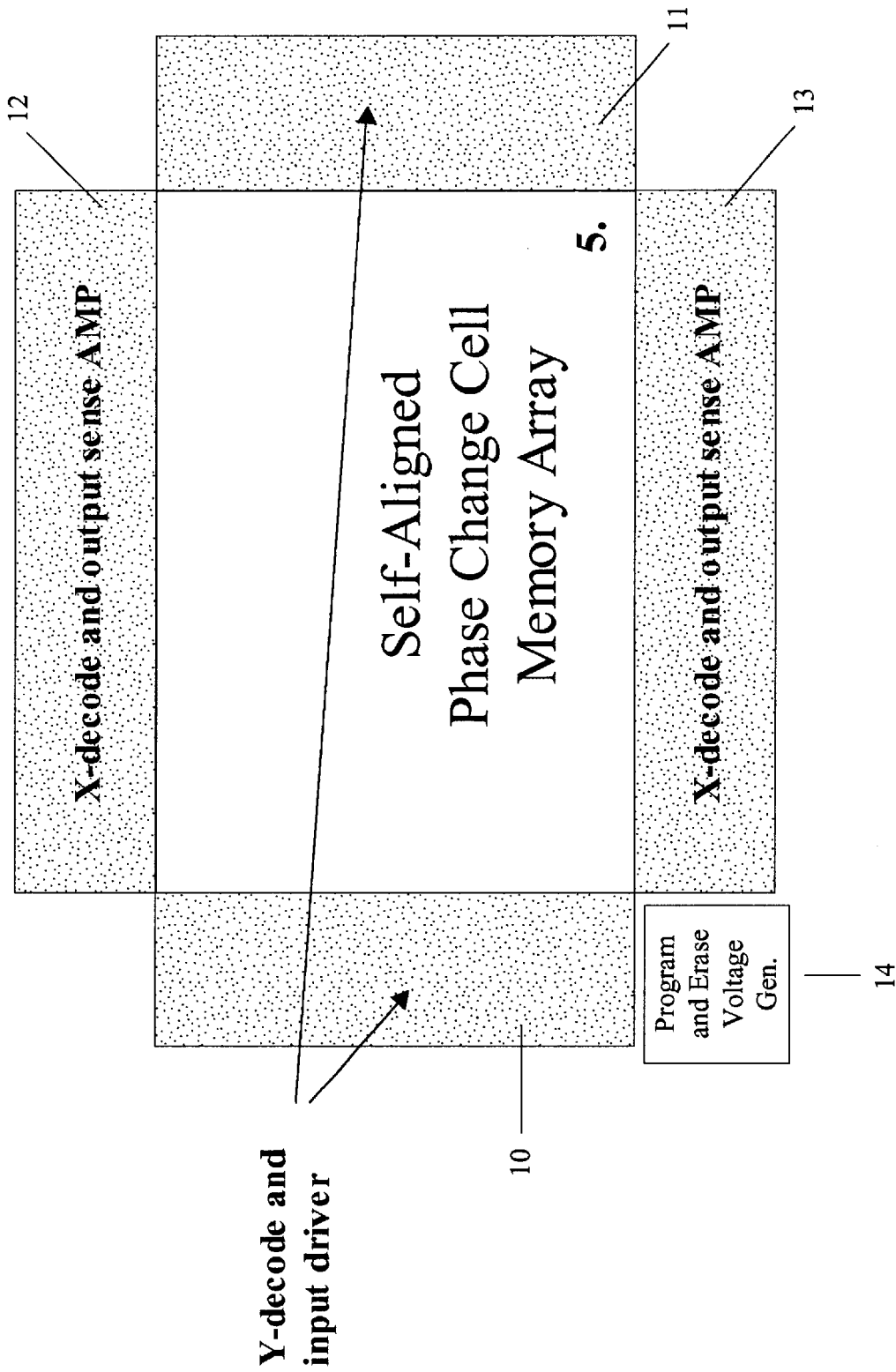
FIG. 1 is a simplified block diagram of an integrated circuit memory device including self-aligned phase change cells according to the present invention.

A detailed description of embodiments of the present invention is provided with reference to FIGS. 1 through 12A–12C. FIG. 1 is a block diagram of an integrated circuit memory device including a memory array 5 comprising self-aligned phase change cells according to the present invention. The integrated circuit includes a substrate in which circuitry supporting the memory array is disposed. The circuitry includes address decoders, input drivers, and output drivers in this example. Thus, y-decoder and input driver circuitry 10 and 11 are disposed next to the array. Also, x-decoder and output sense amplifier circuitry 12 and 13 are disposed next to the array. In one embodiment, a program and erase voltage generator circuit 14 is included on the integrated circuit. Such a voltage generator circuit 14 may include charge pumps or other high voltage or negative voltage generators as required for programming and erasing the phase change cells.

In one embodiment, the integrated circuitry is implemented using standard CMOS techniques. Other manufacturing techniques, including advanced materials and processes may be used for the circuitry integrated in the substrate. In addition, the layout of the circuitry may include logic control circuit beneath the array 5.

Figure 2:
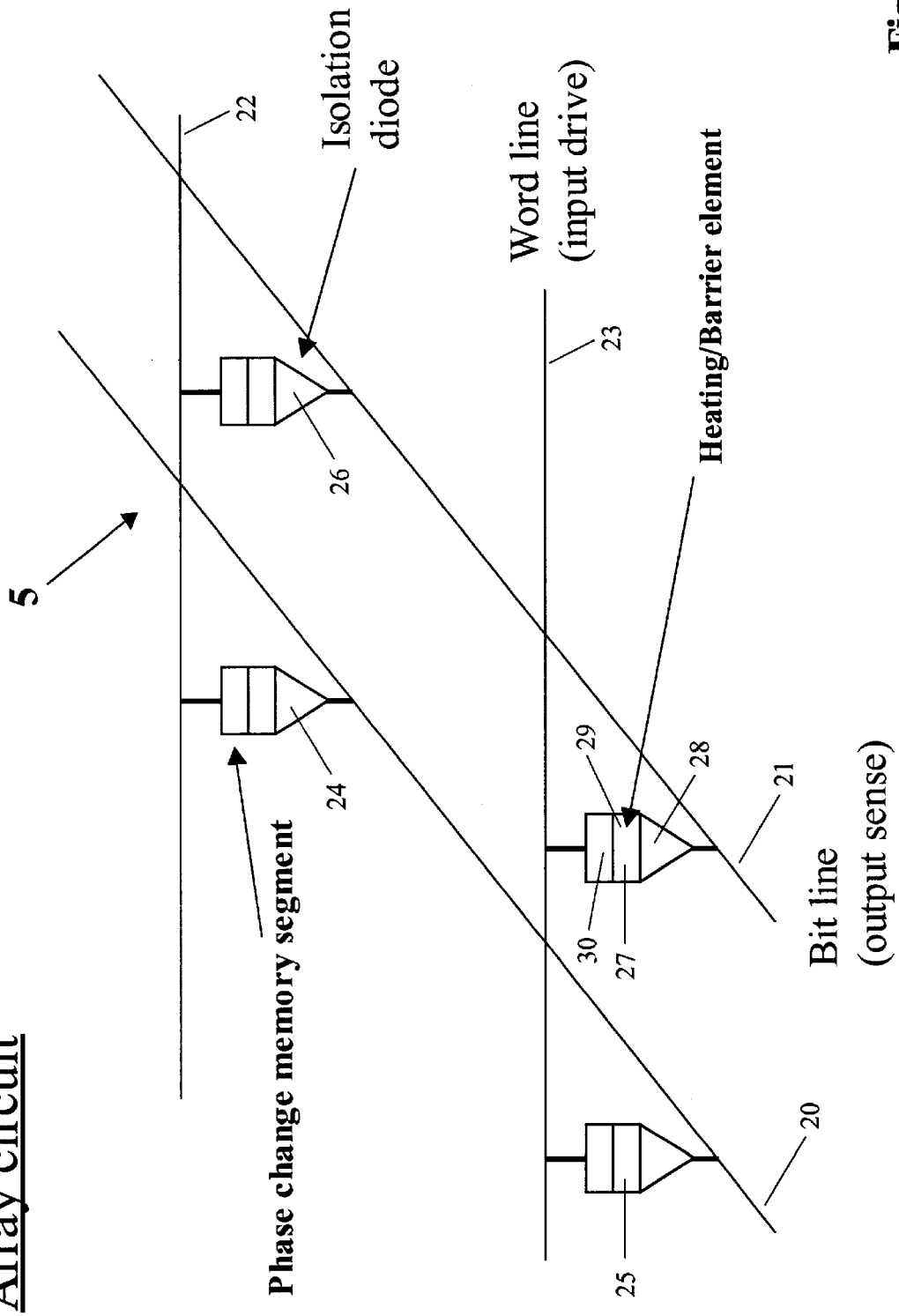
FIG. 2 is a simplified circuit diagram of a memory array including self-aligned phase change cells according to the present invention.

FIG. 2 shows a basic circuit layout for the array 5 of self aligned phase change memory cells according to the present invention. The array 5 includes bit lines 20 and 21, and word lines 22 and 23, which are arranged so that they intersect at memory cells 24–27. The memory cells 24–27 are disposed at the intersections between the bit lines and the word lines. The memory cells, for example memory cell 27, include a selection device 28, a heating/barrier layer 29 and a phase change layer 30. A selection device 28 comprises an isolation diode in one embodiment. The phase change layer 30 comprises the chalcogenide memory element in a preferred embodiment. A memory cell is selected by biasing the word line and bit line which intersect at the selected memory cell, so that the isolation diode of the selection device is conductive, while word lines and bit lines coupled to other memory cells are reverse biased so that the isolation diode of the selection device is nonconductive. As shown in FIG. 2, the bit lines 20, 21 are coupled to output sense amplifier circuitry. The word lines 22, 23 are coupled to input drivers.

A method for manufacture of the memory array, and the structure of the memory cells, of a preferred embodiment of the present invention are described with reference to FIGS. 3-10.

Figure 3:
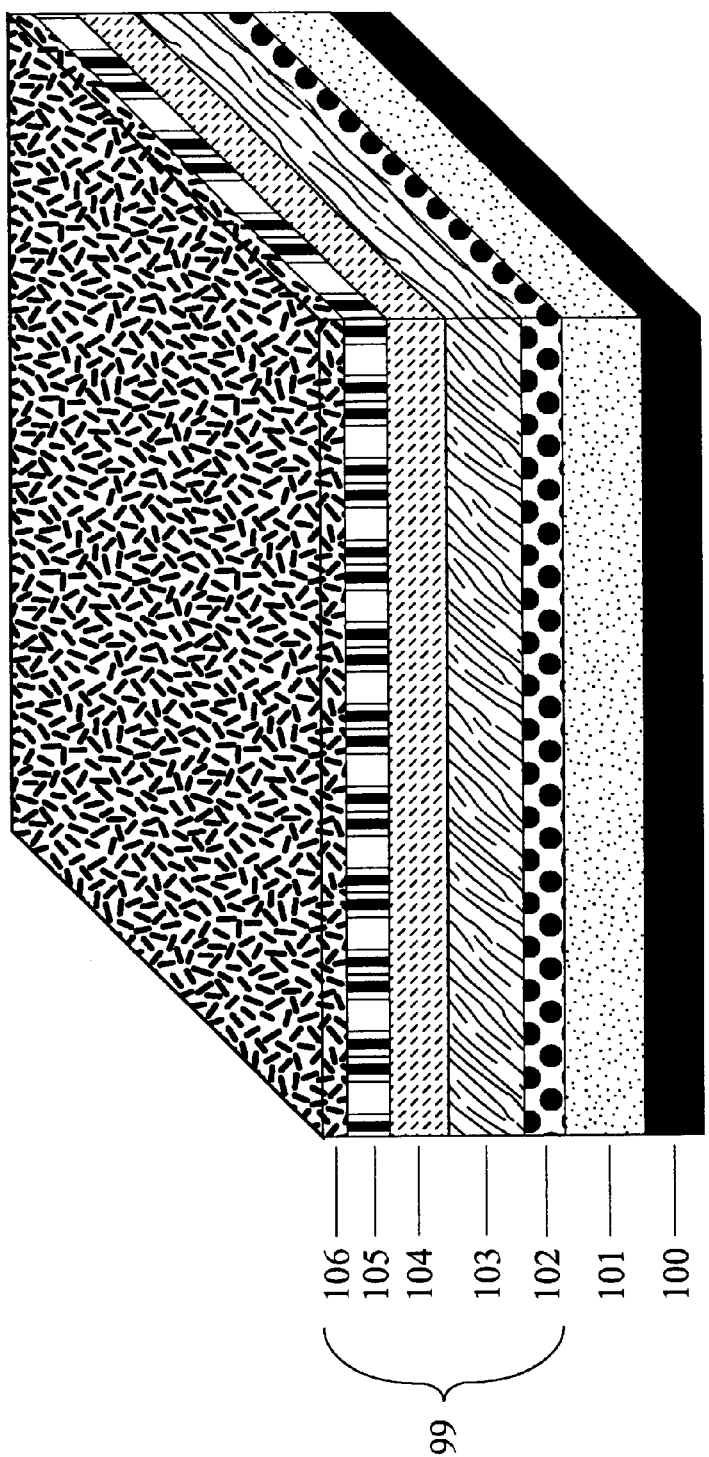
FIG. 3 shows a multi-layer film on a surface of a substrate formed as an intermediate structure in manufacturing of memory cells according to the present invention.

FIG. 3 illustrates a multilayer film 99 formed on a substrate 100. The substrate 100 comprises a semiconductor having circuitry integrated therein as discussed above. The substrate 100 includes an insulator 101 on the surface. The insulator in this embodiment comprises silicon dioxide. The material and thickness of the insulator 101 are chosen so that the memory array is isolated from the underlying integrated circuitry. The multilayer film 99 includes a layer 102 of bit line material, a first polysilicon layer 103, a second polysilicon layer 104, an intermediate heating/barrier layer 105 and a layer 106 of chalcogenide.

The layer 102 of bit line material comprises tungsten in this embodiment between 150 and 600 nanometers thick, deposited using chemical vapor deposition. A variety of other materials are suitable for use as the bit line material, for example heavily doped polysilicon, or other high melting point metals or compounds, such as Ta, Pt, TiN, TaN, WSi and alloys thereof, are possible.

The first polysilicon layer 103 comprises n- doped polysilicon 100 to 600 nanometers thick deposited using CVD, plasma enhanced CVD or sputtering, and doped using a n-type donor such as arsenic or phosphorus. The second polysilicon layer 104 comprises p+ doped polysilicon about 100 to 400 nanometers thick deposited using CVD, plasma enhanced CVD or sputtering, and doped using a p-type donor such as B, Ga, or Indium. The first and second layers of polysilicon are adapted to form a selection device in the form of the diode. The layers of materials chosen to implement the selection device can implement junctions other than p+/n–junctions. Other types of junctions such as n+/p–, p+/intrinsic/n–, n+/intrinsic/p–, p+/n+, p+/intrisic/n+and Schottky junctions are possible. Also other selection device structures may be used.

The intermediate heating/barrier layer 105 in this embodiment comprises a film of material 20 to 200 nanometers thick deposited for example by sputtering or CVD. In the preferred embodiment, the intermediate layer acts as a heating element to heat up phase change material and a barrier to electromigration and diffusion. In addition, the material of the intermediate layer does not react with the phase change material and the selection element. In the preferred system, the resistance of the intermediate layer is higher than the resistance of the phase change material in a high resistance phase. In this manner, it can act as a heating plate to facilitate changing phase of the phase change material adjacent to the barrier layer. Suitable materials include TiW, TiAlN, Ta, Mo and others. A variety of other materials characterized by relatively high resistance, compared to the high resistivity phase of the phase change material, and good barrier characteristics can be utilized. The intermediate layer 105 can be chosen from a compound which includes one element selected from the group consisting of Ti, V, Cr, Zr, Nb, M, Hf, Ta, W and two or more elements selected from the group B, C, N, Al, Si, P and S. Candidate barrier materials are described in U.S. Reissue Patent No. RE37,259 at column 13, line 31 through column 14, line 4. The intermediate layer 105 in various embodiments may include one material chosen for barrier characteristics and another material chosen for suitability as heating plate. Preferably, a single material performs both functions.

The top layer in the multilayer film shown in FIG. 3 is the phase change material. In this example, the phase change material comprises a film of chalcogenide. In some embodiments, thin films of materials chosen to act as top or bottom electrodes for the chalcogenide layer can be included. Although chalcogenide is utilized in this embodiment, all kinds of phase change materials can be used. The chalcogenide material in this example is about 5 to 200 nanometers thick, and preferably between 20 and 40 nanometers thick. Typically chalcogenide materials are deposited using sputtering. Representative phase change materials include chalcogenides such as those described in U.S. Reissue Patent No. RE37,259.

Figure 4:
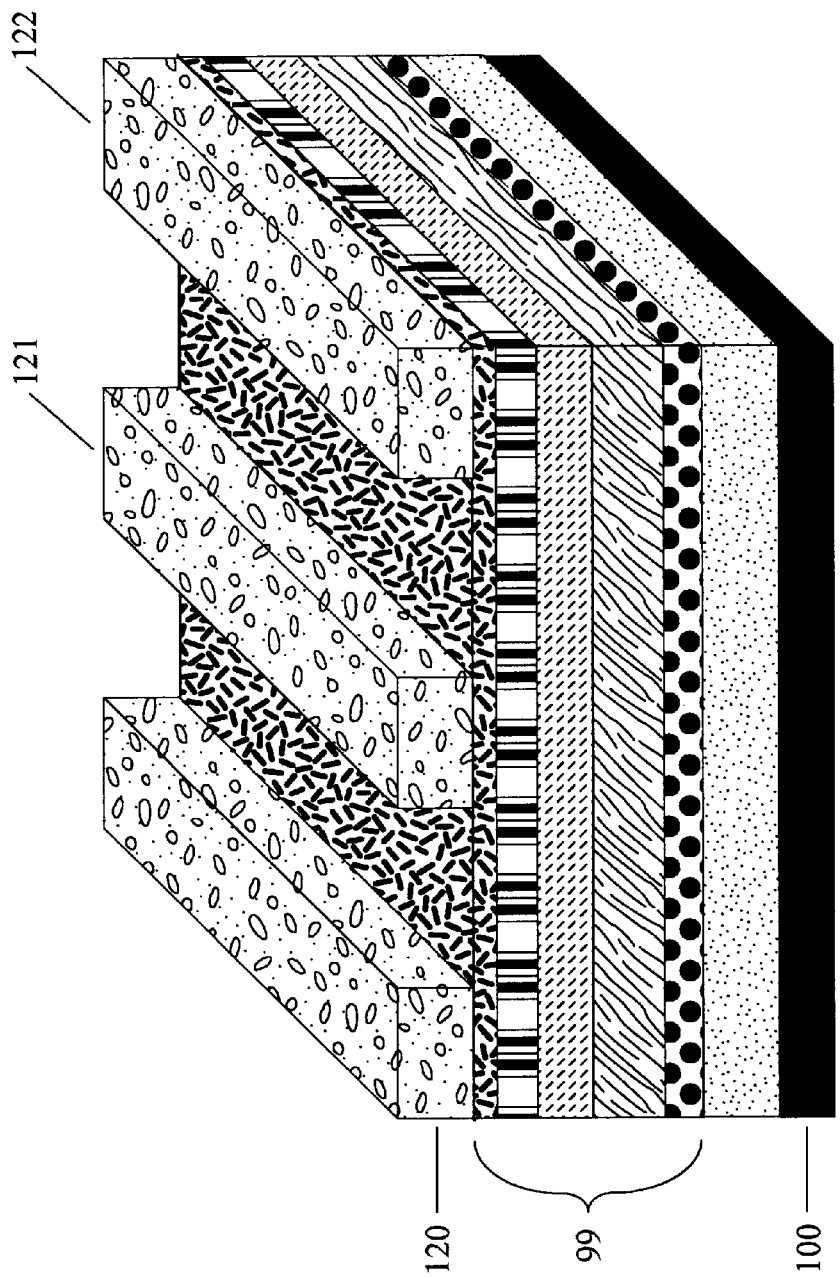
FIG. 4 illustrates the first photoresist mask pattern for defining a first plurality of lines including bit lines in an array of memory cells according to the present invention.

After formation of the multilayer film shown in FIG. 3, the next step in the manufacturing process is shown in FIG. 4. This next step is used for defining a first plurality of lines using photoresist having a first mask pattern as shown in FIG. 4. Thus, lines 120, 121, 122 are defined using photoresist. The lines 120, 121, 122 are substantially parallel and extend in a first direction, and are used to define the bit lines for the array.

Figure 5:
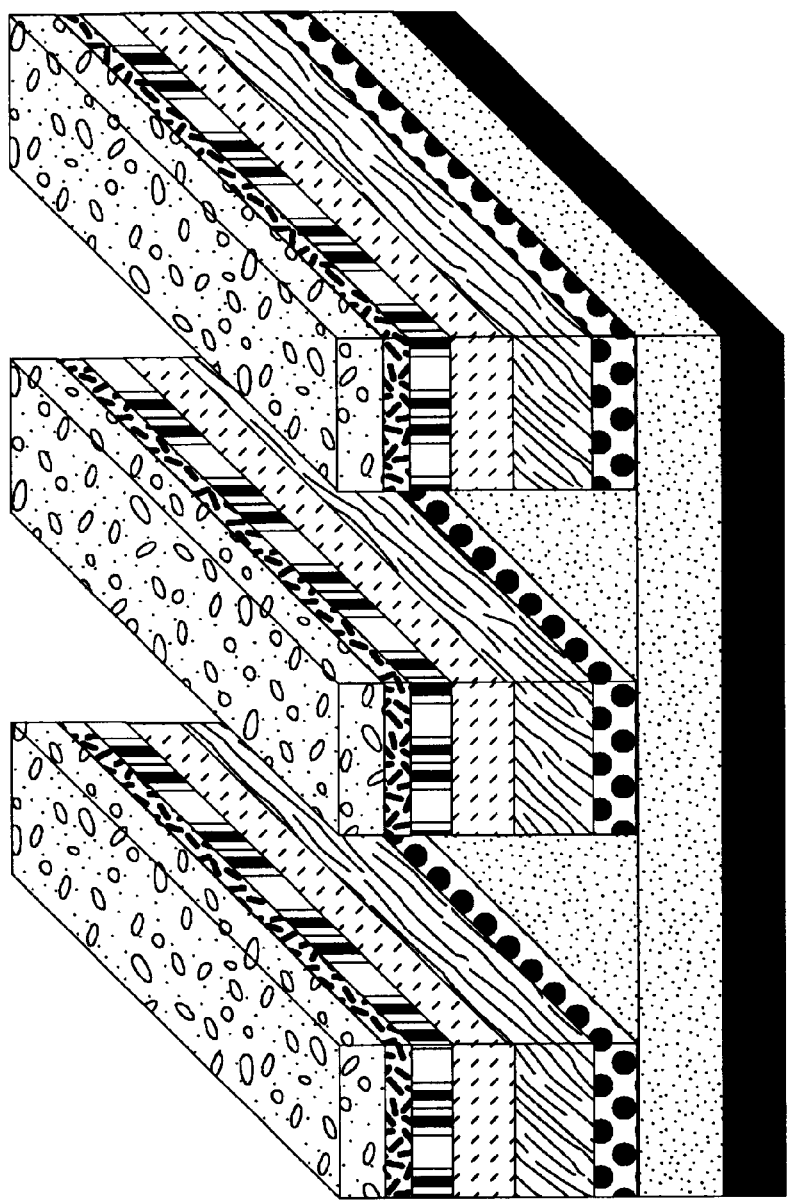
FIG. 5 shows the results of etching gaps between the first plurality of lines of the mask pattern of FIG. 4.
Figure 6:
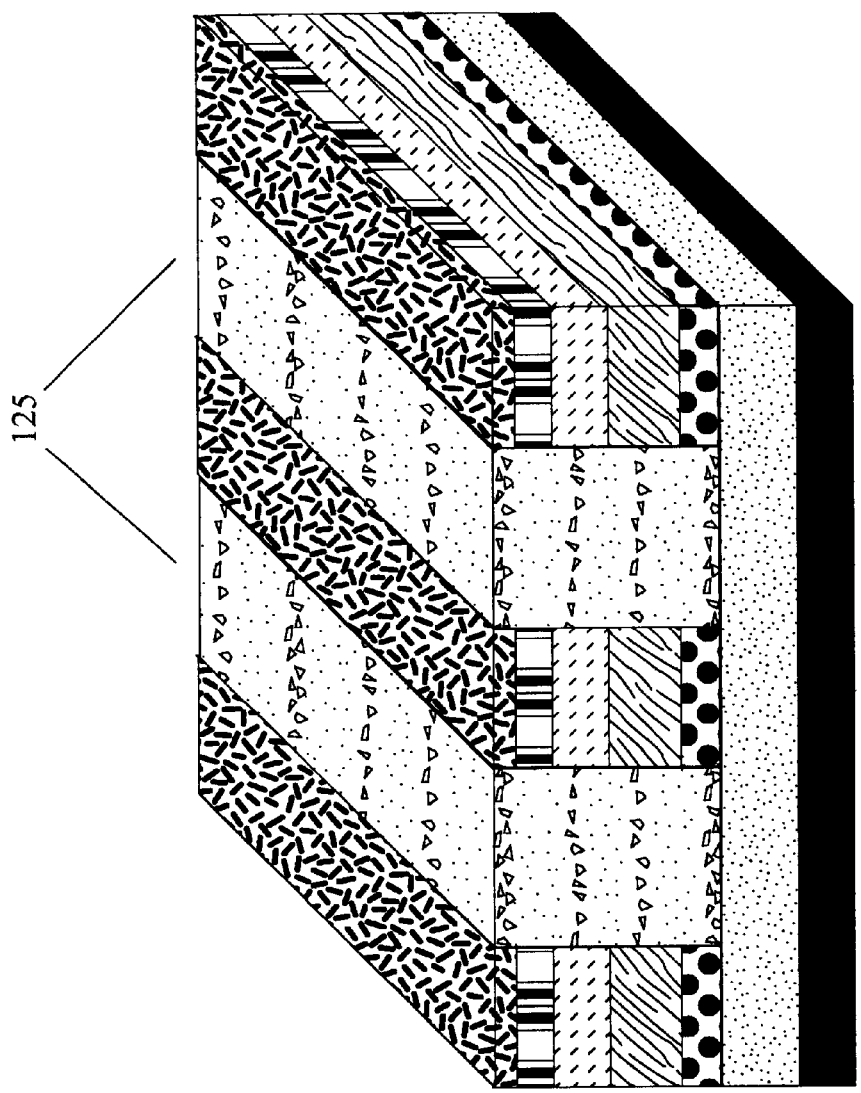
FIG. 6 illustrates an insulator filling the gaps between the lines of FIG. 5.

FIG. 5 illustrates gaps etched, using reactive ion etching, into the multilayer film using the mask shown in FIG. 4. The etching of the gaps is stopped at the insulator layer 101, and defines bit lines in the bit line layer 102. As shown in FIG. 6, the gaps are filled with an oxide 125 or other good insulation material, using a high-density plasma chemical vapor deposition process, or other process suitable for filling narrow gaps.

Figure 7:
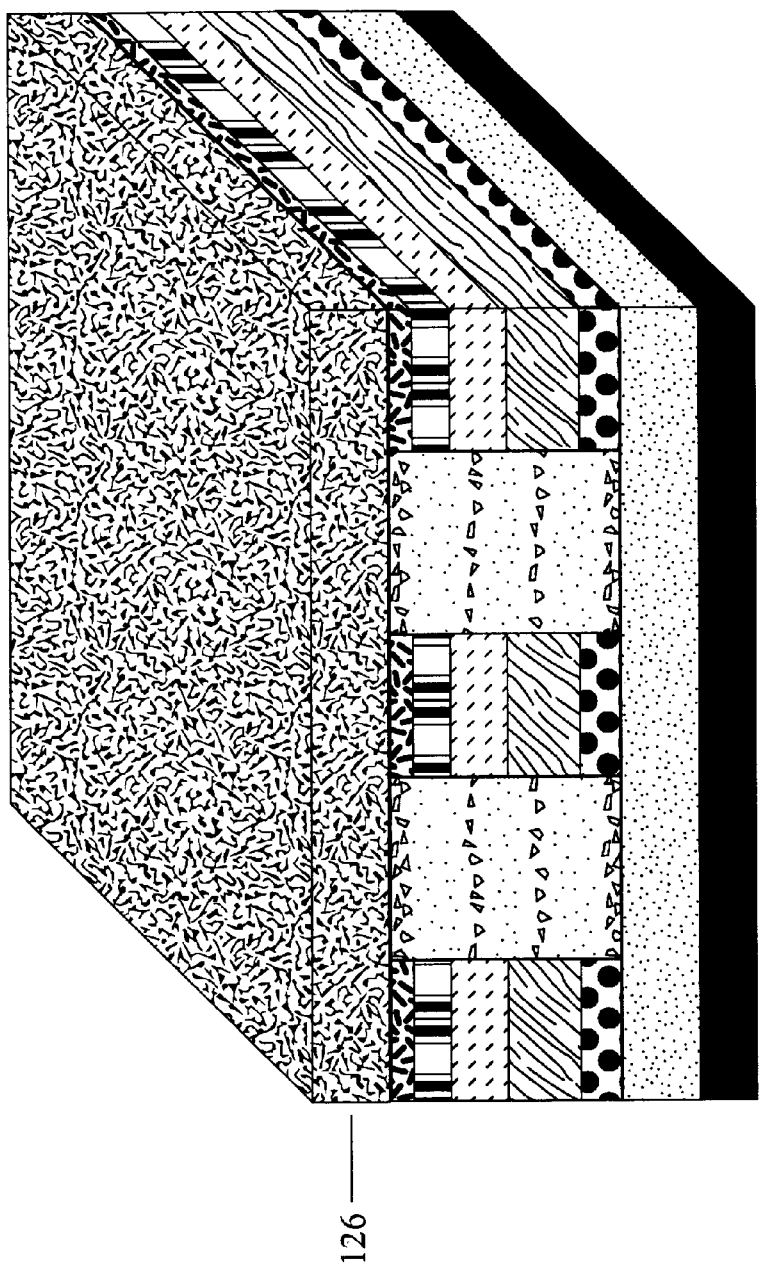
FIG. 7 illustrates formation of a conductive layer over the structure of FIG. 6.

FIG. 7 illustrates a next step in the process of manufacturing them every array. In the step, a word line conductor layer 126 is deposited over the lines and oxide 125 of the structure shown in FIG. 6. The word line conductor layer 126 comprises a conductive material such as W, Ta, Pt, TiN, TaN, WSi or heavily doped polysilicon. Such materials may be deposited for example by sputtering or chemical vapor deposition.

Figure 8:
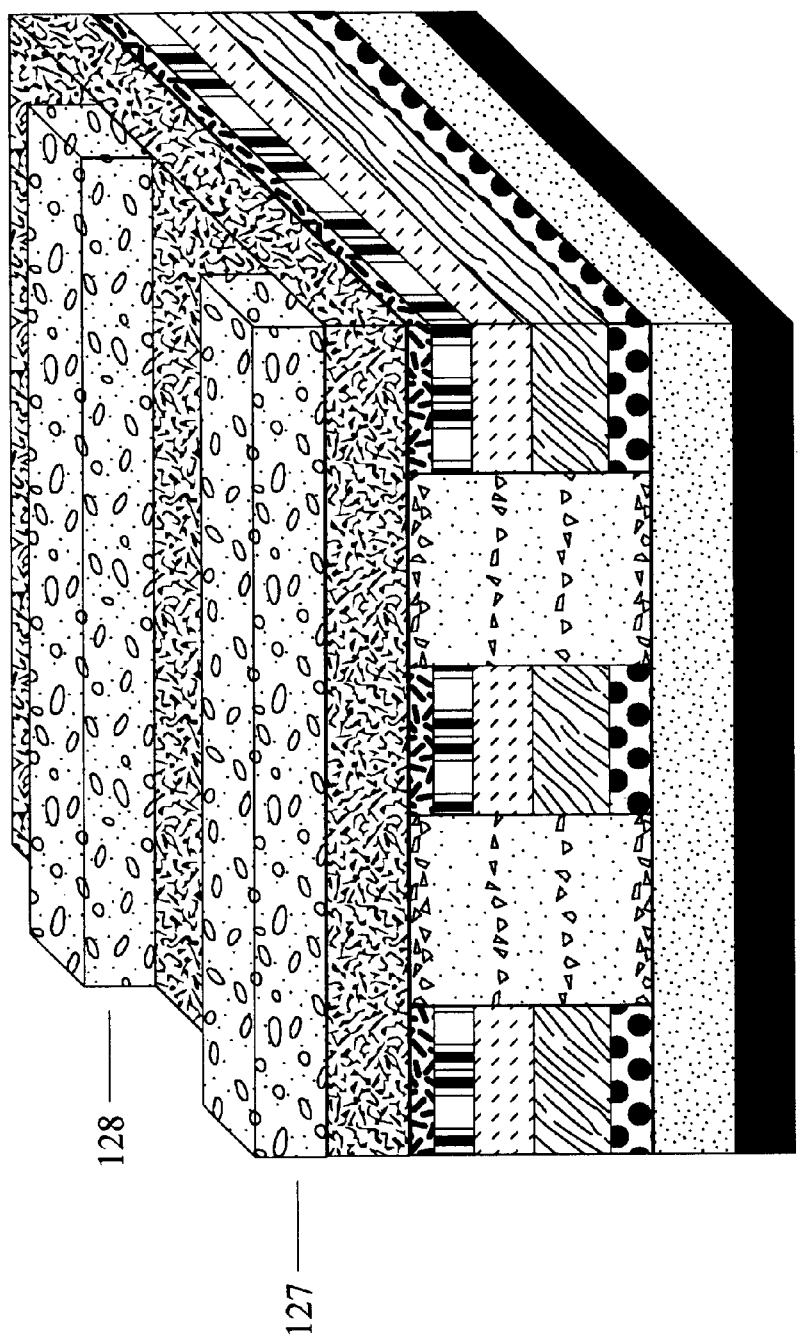
FIG. 8 illustrates the second photoresist mask pattern for defining a second plurality of lines including word lines in an array of memory cells according to the present invention.

FIG. 8 illustrates a second plurality of lines defined by a second mask step resulting in photoresist lines 127, 128 as shown. The second plurality of lines extended a second direction generally orthogonal to the direction of the bit lines.

Figure 9:
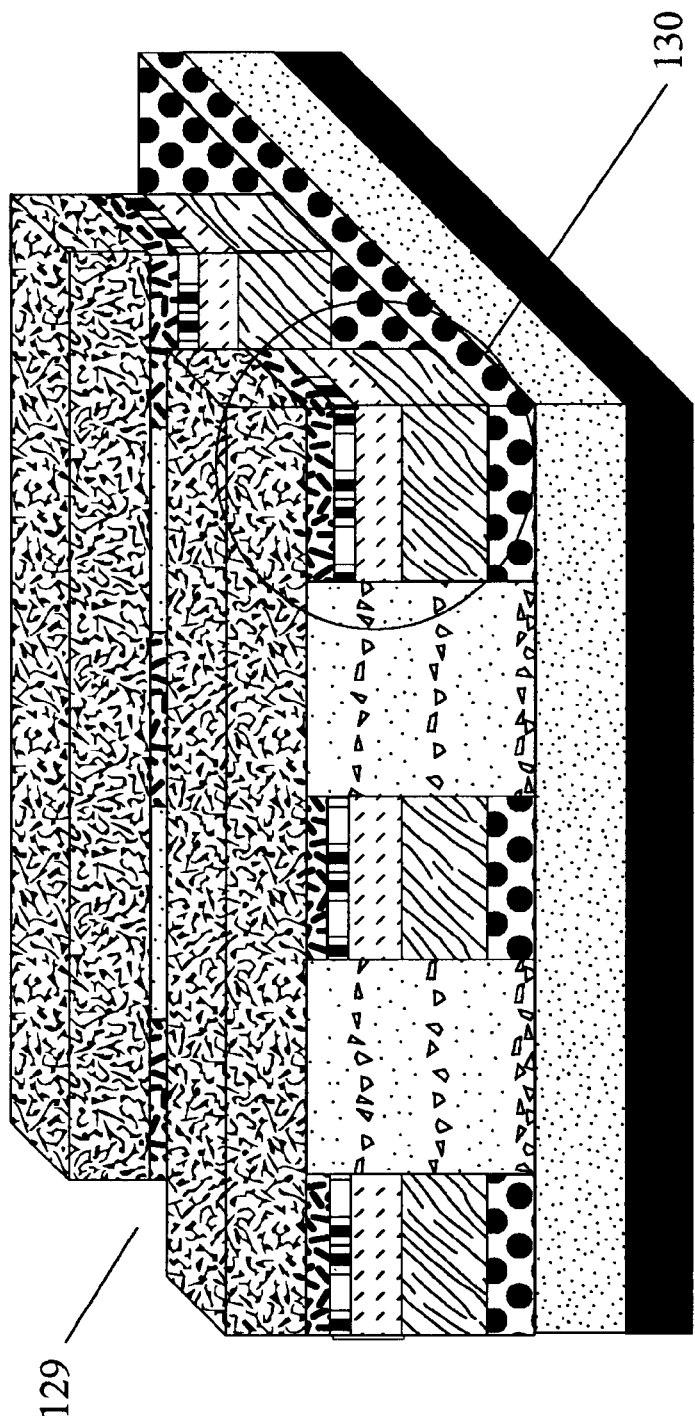
FIG. 9 shows the results of etching gaps between the second plurality of lines of the mask pattern of FIG. 8, wherein said etching does not penetrate the bit lines.
Figure 10:
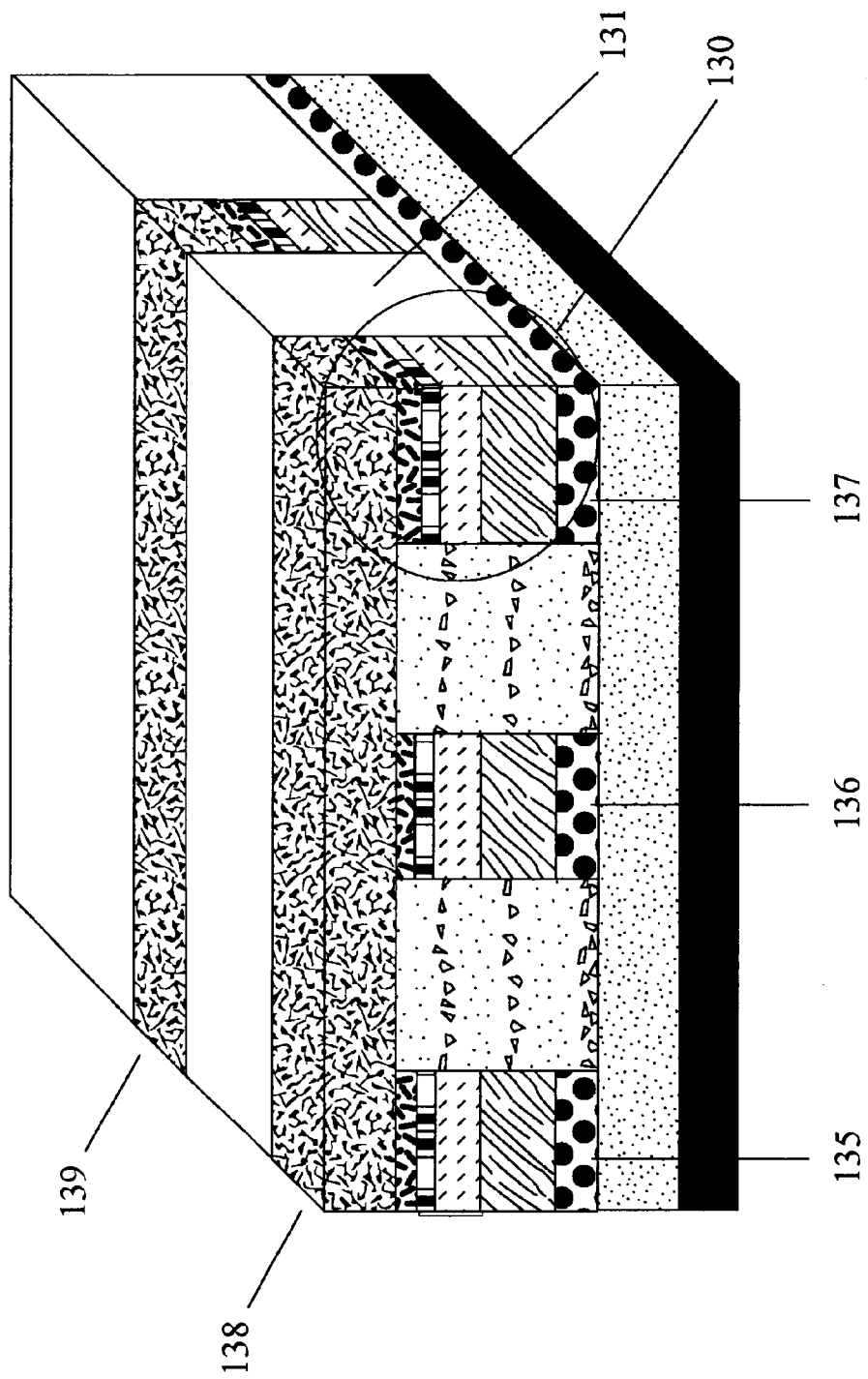
FIG. 10 illustrates an array of memory cells manufactured according to the present invention, with an insulator filling gaps between the lines of FIG. 9.

FIG. 9 shows the structure resulting from a reactive ion etching of the gaps (e.g. gap 129) between the second plurality of lines in the structure of FIG. 8. The etching is stopped on the bit line layer. As a result of the second etching step, memory cells (e.g. cell 130) are disposed between the word lines and a bit lines at the intersections. The word lines and the bit lines lie in essentially parallel planes, but intersect in the plan view of the array. The memory cells are self-aligned with the word lines and bit lines, because the sides of the cells are defined using the same mask steps as are used to define the word lines and the bit lines. As shown in FIG. 10, a final step in formation of the memory array is the filling of the gaps in the structure of FIG. 9 with an insulator 131 using any high-density plasma chemical vapor deposition of oxide or other suitable insulator.

The basic structure of the memory array is shown in FIG. 10. The array includes a first plurality of conductive lines 135, 136, 137 and a second plurality of conductive lines 138, 139. The second plurality of conductive lines 138, 139 crosses over the first plurality of conductive lines at intersections. Memory cells, for example memory cell 130, are disposed at the intersections, and are in series electrical contact with the first and second pluralities of conductive lines. The memory cells comprise self-aligned structures including a selection device formed from remaining portions of the first and second polysilicon layers, an intermediate heating/barrier plate layer and a chalcogenide element, all arranged vertically at intersections between the first and second pluralities of conductive lines.

Figure 11:
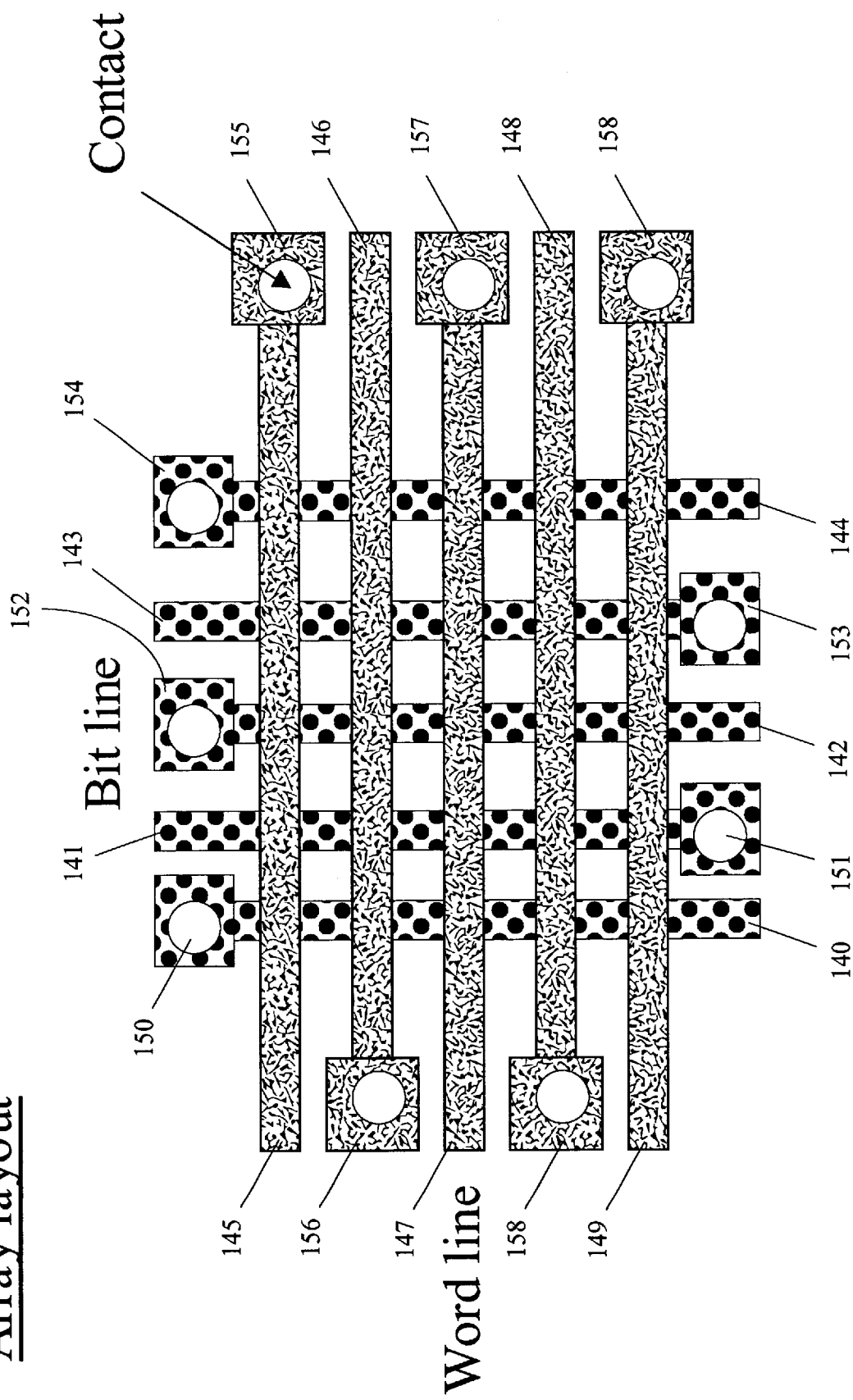
FIG. 11 provides a layout view of the bit lines and word lines in the structure of FIG. 10, where self-aligned memory cells occur at intersections, and including contacts to integrated circuitry underlying the array.

A layout plan view of the array can be seen with reference to FIG. 11. Thus, bit lines 140–144 are arranged vertically in the array shown in FIG. 11. Word lines 145–149 are arranged horizontally in the array. The bit lines 140–144 extend to respective contact structures 150–155. Likewise the word lines 145–149 extend to respective contact structures 155–159. The contact structures comprise for example tungsten plugs extending through the insulator layer 101 to the circuitry integrated in the substrate.

Operation of the memory cells of the present invention is described with reference to FIGS. 12A–12C. FIG. 12A illustrates the basic memory cell of the present invention including a selecting element 200, a barrier/heating plate layer 201, and a phase change element 202. As shown in FIG. 12B, when current is applied the barrier/heating plate layer 201 heats up to the phase change temperature of the phase change element 202. The phase change element comprises material having a first solid-state phase with a lower resistance, and a second solid-state phase with a higher resistance. Material of the phase change element 202 in the region 203 adjacent to barrier/heating plate layer 201 changes phase. The bulk resistance of the phase change element 202 indicates the relative amounts of material of the phase change element in first and second solid-state phases. By controlling the phase change, data is stored in the phase change element 202.

FIG. 12C illustrates a multibit embodiment, including a selecting element 200, a barrier/heating plate element 201, and a phase change element 202. In this embodiment, the phase change is controlled so that more than 2 memory states are achieved. Thus for example, in state 1 the material in region 205 is in the high resistance state. In state 2, the material in regions 205 and 206 is in the high resistance state. In state 3, the material in regions 205, 206 and 207 is in the high resistance state. In state 4, the material in regions 205, 206, 207, and 208 are all in the high resistance state. So, in this example, there are four different resistance states stored in a cell, and the four different states can represent 2 bits in one cell.

Basic operation of the device can be understood with reference to FIG. 10. The top metal lines act as word lines, and the bottom metal lines act as bit lines. The p+/n− polysilicon junction acts as a diode to isolate/select each memory cell. When programming or erasing a cell, a suitable voltage is built between the word lines and bit lines to supply enough current penetrating the chalcogenide and barrier/heating plate layer to generate heat. By controlling the heating rate, the solid-state phase of the chalcogenide is controlled to establish a memory state indicated by the bulk resistance of the chalcogenide. When reading the cell, a current flows from the word lines through the chalcogenide, barrier/heating plate layer and p+/n− junction to the bit line. By distinguishing the voltage or current level of the specific cell, the data is sensed.

The memory array of the present invention can be used for one-time programmable non-volatile memory, non-volatile memory programmed during manufacture, and electrically erasable and programmable random access memory suitable for thousands of program and erase cycles.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:

a substrate;

a first plurality of conductive lines on the substrate extending in a first direction;

a second plurality of conductive lines above the first plurality of conductive lines, and extending in second direction and crossing over the first plurality of conductive lines at intersections;

a plurality of memory cells at said intersections and in electrical contact with the first and second pluralities of conductive lines, the memory cells comprising self-aligned structures including a selection device, and a phase change memory element.

2. The memory device of claim 1, wherein said memory cells comprise respective multi-layer stacks including a layer or layers of material adapted to act as said selection device, and a layer or layers of material selected for formation of a heating/barrier element, and a layer or layers of material adapted to act as said phase change memory element.

3. The memory device of claim 1, wherein said phase change memory elements comprise respective chalcogenide bodies.

4. The memory device of claim 3, wherein said chalcogenide bodies comprise respective films having substantially uniform thickness across said intersections.

5. The memory device of claim 1, wherein said memory cells comprise respective multi-layer stacks including a layer or layers of material adapted to act as said selection device, and an intermediate layer of material having a first resistance and a layer of phase change material adjacent the intermediate layer, and having a first phase having a lower resistance and a second phase having a higher resistance, wherein the first resistance is greater than the higher resistance of the phase change material in the second phase.

6. The memory device of claim 5, wherein said intermediate layer comprises a barrier to at least one of diffusion and electromigration.

7. The memory device of claim 5, wherein said layer or layers of material adapted to act as a selection device, comprise a first polysilicon layer with p-type dopant and a second polysilicon layer with n-type dopant adapted for formation of a diode.

8. The memory device of claim 1, wherein said memory cells comprise respective multi-layer stacks including a layer or layers of material adapted to act as said selection device, and a layer or layers of material selected for formation of a heating/barrier element, and a layer or layers of material adapted to act as said phase change memory element, wherein said layer or layers of material adapted to act as said phase change memory element comprise a layer of chalcogenide.

9. The memory device of claim 8, wherein said layer of chalcogenide overlays said layer or layers of material selected for formation of a selection device.

10. The memory device of claim 8, wherein said layer or layers of material adapted to act as a selection device, comprise a first polysilicon layer with p-type dopant and a second polysilicon layer with n-type dopant adapted for formation of a diode.

11. The memory device of claim 1 wherein said substrate includes an insulator at said surface.

12. The memory device of claim 1, wherein said substrate comprises an integrated circuit device, with an insulator at said surface.

13. The memory device of claim 1, wherein said phase change memory element is adapted to store more than one bit by assuming more than two bulk resistance states in response to programming current.

14. A memory device, comprising:
- a substrate having a surface, including integrated circuitry and an insulation layer on the surface;
- a first plurality of conductive lines on the insulation layer on the surface of the substrate extending in a first direction, and contacting said integrated circuitry at contact points;
- a second plurality of conductive lines above the first plurality of conductive lines, and extending in second direction and crossing over the first plurality of conductive lines at intersections, and contacting said integrated circuitry at contact points;
- a plurality of memory cells at said intersections and in electrical contact with the first and second pluralities of conductive lines, the memory cells comprising self-aligned structures including a selection device, an intermediate layer and a chalcogenide memory element.

15. The memory device of claim 14, wherein said chalcogenide memory elements comprise respective chalcogenide films having substantially uniform thickness across said intersections.

16. The memory device of claim 14, wherein said intermediate layer has a first resistance and said chalcogenide memory element comprises a chalcogenide material having a first phase having a lower resistance and a second phase having a higher resistance, wherein the first resistance is greater than the higher resistance of the chalcogenide material in the second phase.

17. The memory device of claim 14, wherein the intermediate layer comprises a heating element.

18. The memory device of claim 14, wherein the intermediate layer comprises a barrier to at least one of diffusion and electromigration.

19. The memory device of claim 14, wherein said selection devices comprise a first polysilicon layer with p-type dopant and a second polysilicon layer with n-type dopant adapted for formation of a diode.

20. The memory device of claim 14, wherein said chalcogenide memory element is adapted to store more than one bit by assuming more than two bulk resistance states in response to programming current.

* * * * *